United States Patent
Lee et al.

(10) Patent No.: US 7,141,456 B2
(45) Date of Patent: Nov. 28, 2006

(54) METHODS OF FABRICATING FIN-FIELD EFFECT TRANSISTORS (FIN-FETS) HAVING PROTECTION LAYERS

(75) Inventors: Deok-Hyung Lee, Gyeonggi-do (KR); Si-Young Choi, Gyeonggi-do (KR); Byeong-Chan Lee, Gyeonggi-do (KR); In-Soo Jung, Gyeonggi-do (KR); Jin-Hwa Heo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 10/871,742

(22) Filed: Jun. 18, 2004

(65) Prior Publication Data

US 2004/0262676 A1 Dec. 30, 2004

(30) Foreign Application Priority Data

Jun. 30, 2003 (KR) ............... 10-2003-0043628

(51) Int. Cl.
*H01L 21/84* (2006.01)
*H01L 21/332* (2006.01)

(52) U.S. Cl. ............... 438/135; 438/151; 257/E21.411; 257/E21.158

(58) Field of Classification Search ............... 257/353, 257/E21.129, E21.445, E21.448, E21.567, 257/E21.569, E27.062, E29.056, E29.315, 257/E21.001, E27.001
See application file for complete search history.

(56) References Cited

U.S. PATENT DOCUMENTS

| | | | | |
|---|---|---|---|---|
| 5,920,108 A | * | 7/1999 | Hemmenway et al. | 257/508 |
| 6,660,613 B1 | * | 12/2003 | Kim et al. | 438/424 |
| 6,706,571 B1 | * | 3/2004 | Yu et al. | 438/157 |
| 6,762,448 B1 | * | 7/2004 | Lin et al. | 257/302 |
| 6,835,996 B1 | * | 12/2004 | Kim et al. | 257/510 |
| 2004/0262687 A1 | * | 12/2004 | Jung et al. | 257/347 |
| 2005/0258476 A1 | * | 11/2005 | Cheng et al. | 257/327 |

\* cited by examiner

*Primary Examiner*—Walter Lindsay, Jr.
*Assistant Examiner*—Thu-Huong Dinh
(74) *Attorney, Agent, or Firm*—Myers Bigel Sibley & Sajovec

(57) ABSTRACT

Methods for fabricating Fin-Field Effect Transistors (Fin-FETs) are provided. A fin is formed on an integrated circuit substrate. The fin defines a trench on the integrated circuit substrate. A first insulation layer is formed in the trench such that a surface of the first insulation layer is recessed beneath a surface of the fin exposing sidewalls of the fin. A protection layer is formed on the first insulation layer and a second insulation layer is formed on the protection layer in the trench such that protection layer is between the second insulation layer and the sidewalls of the fin. Related Fin-FETs are also provided.

13 Claims, 15 Drawing Sheets

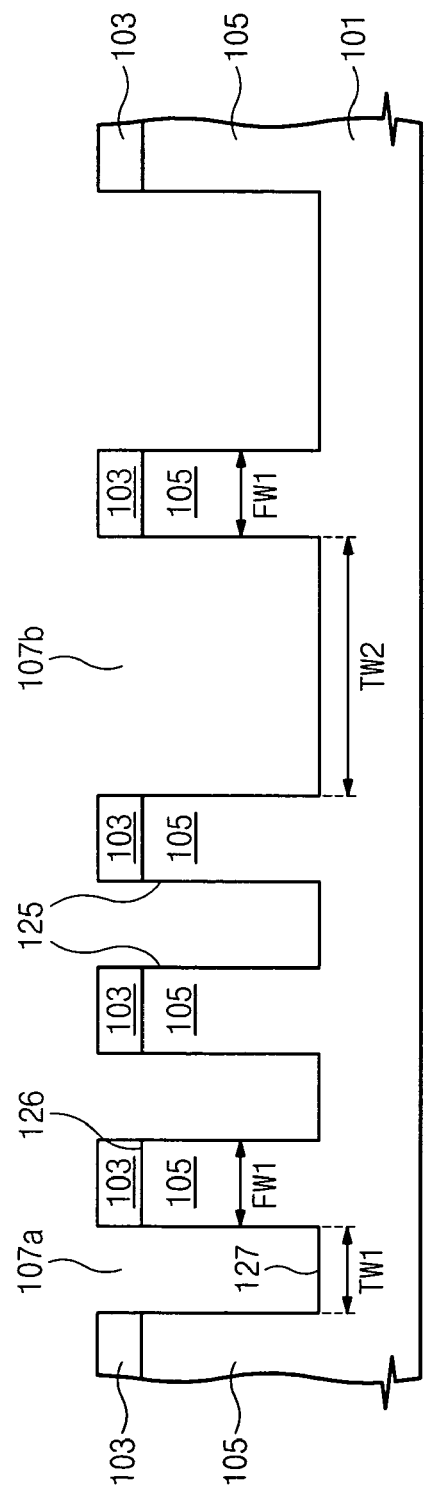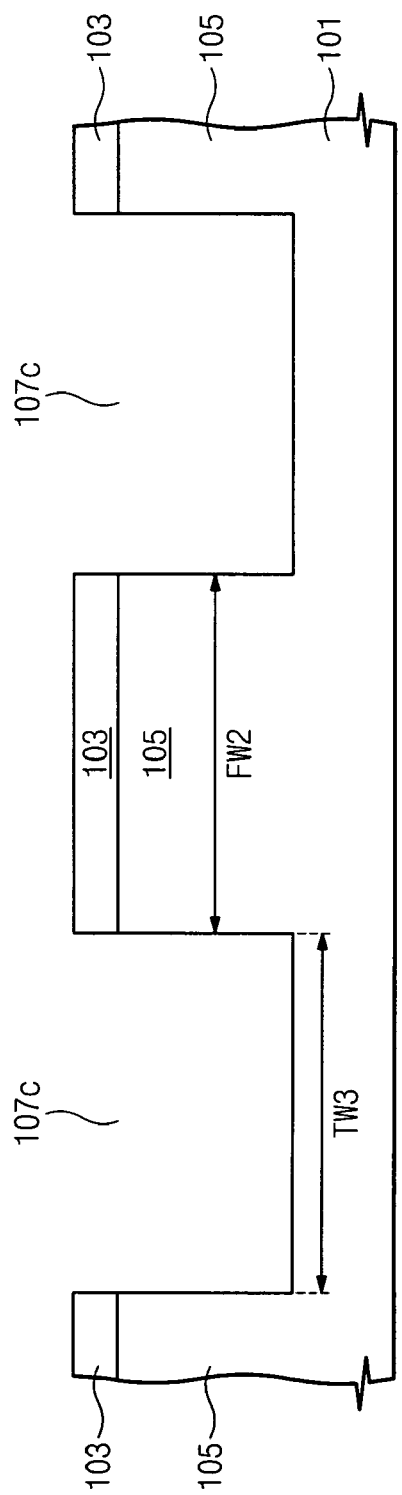

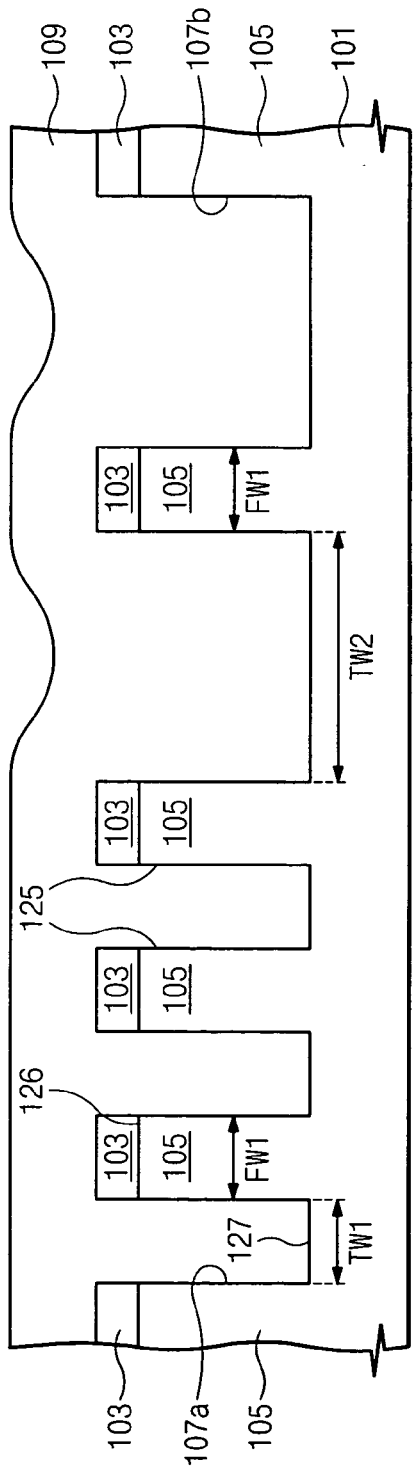
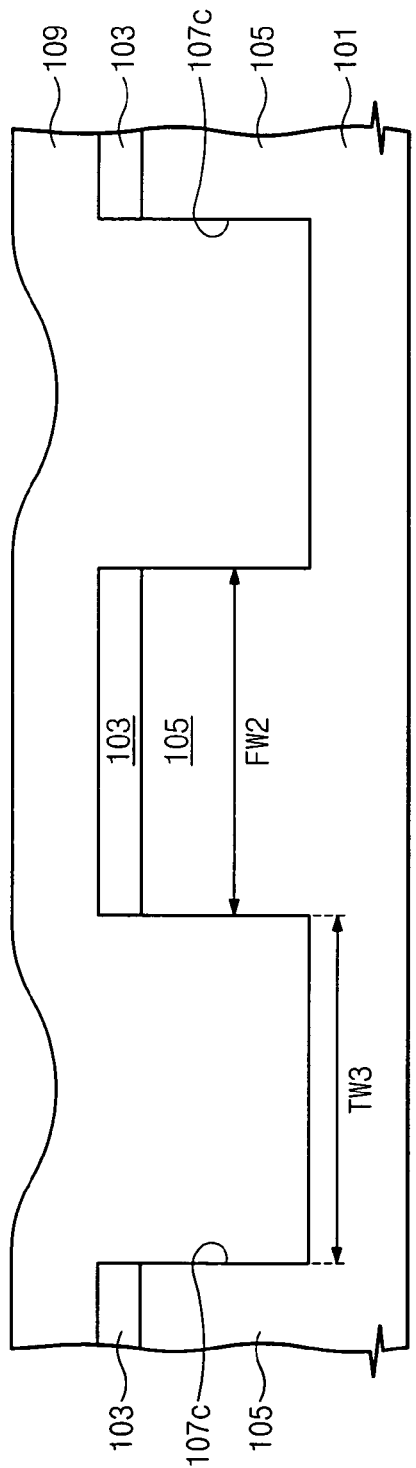

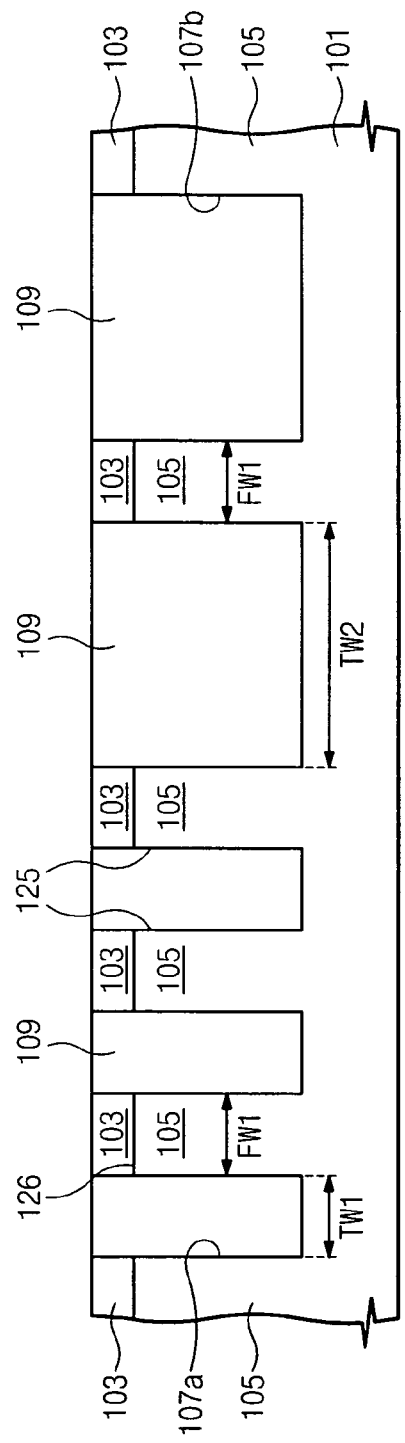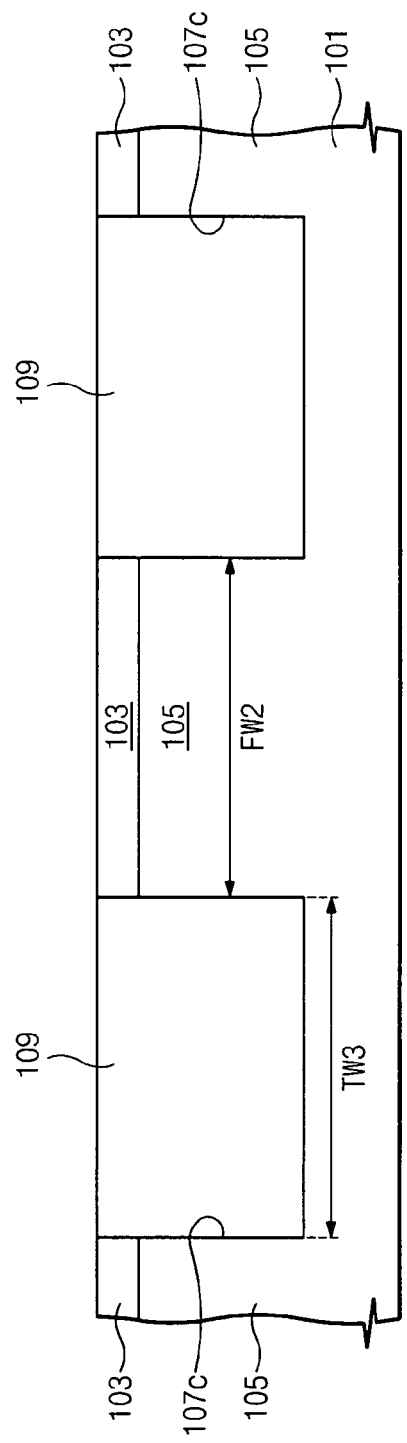

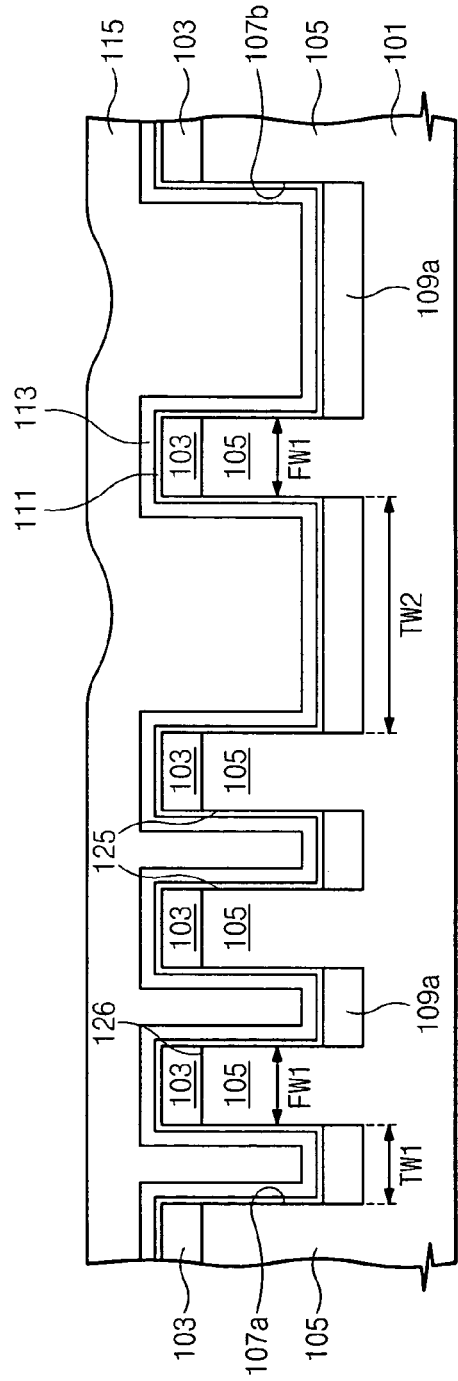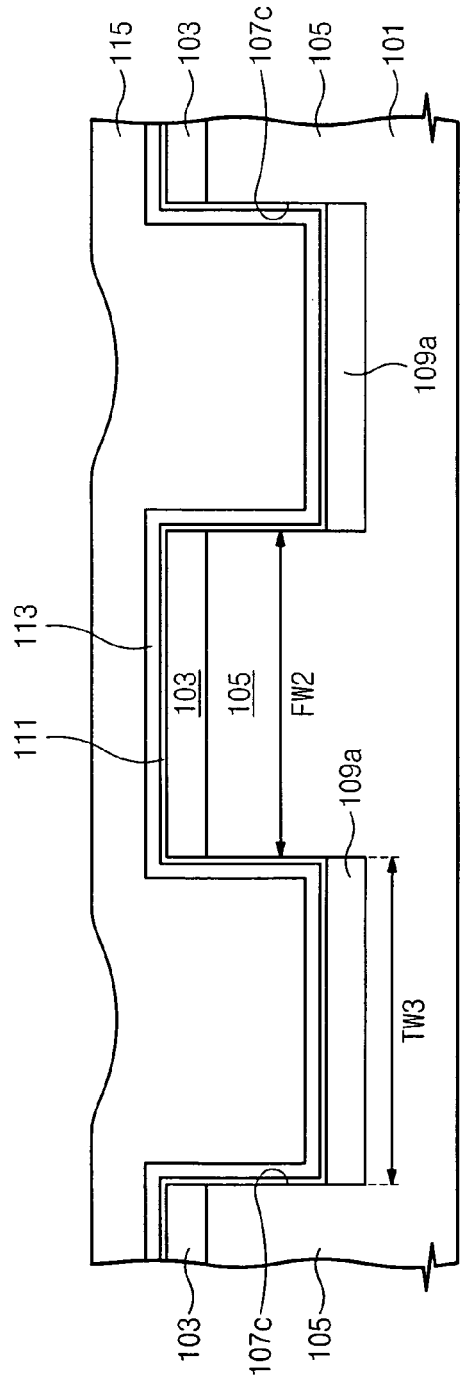

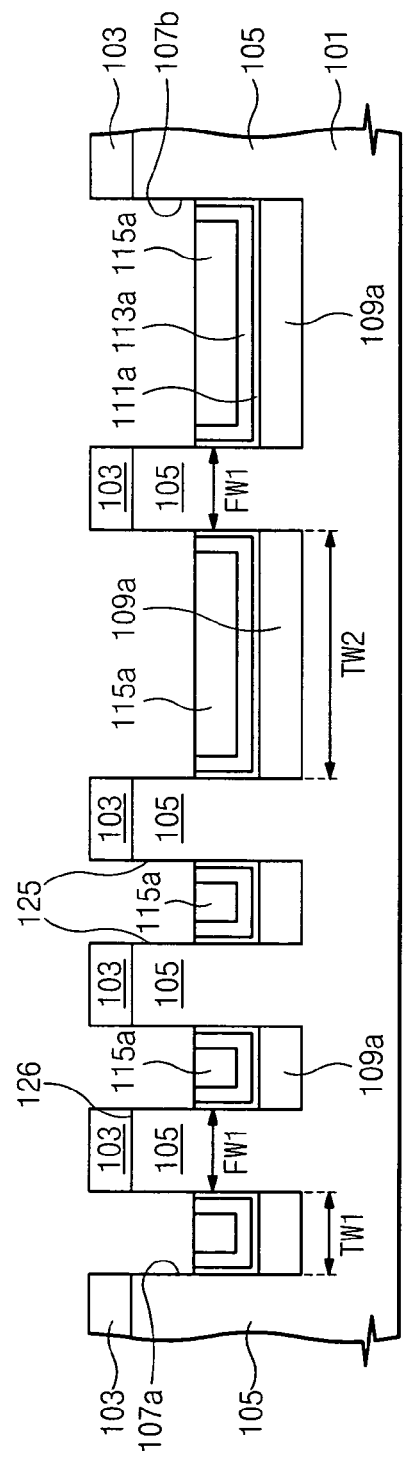
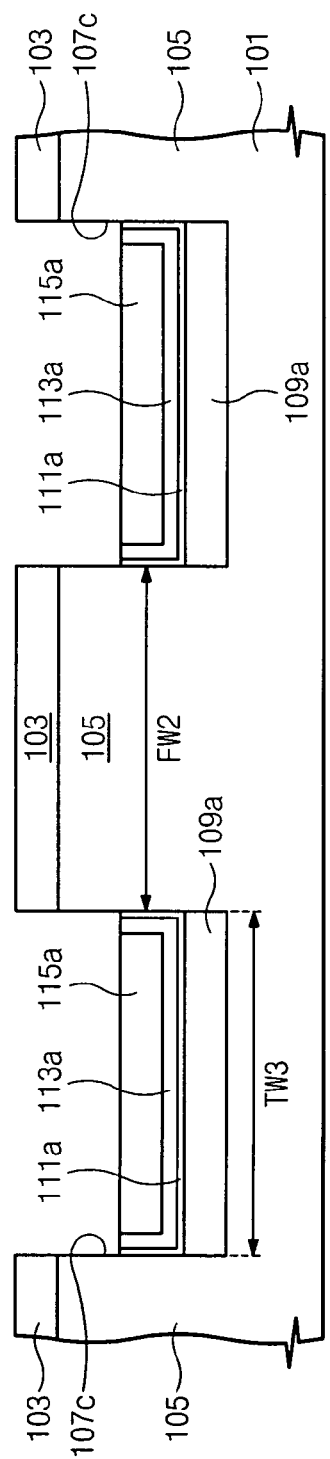

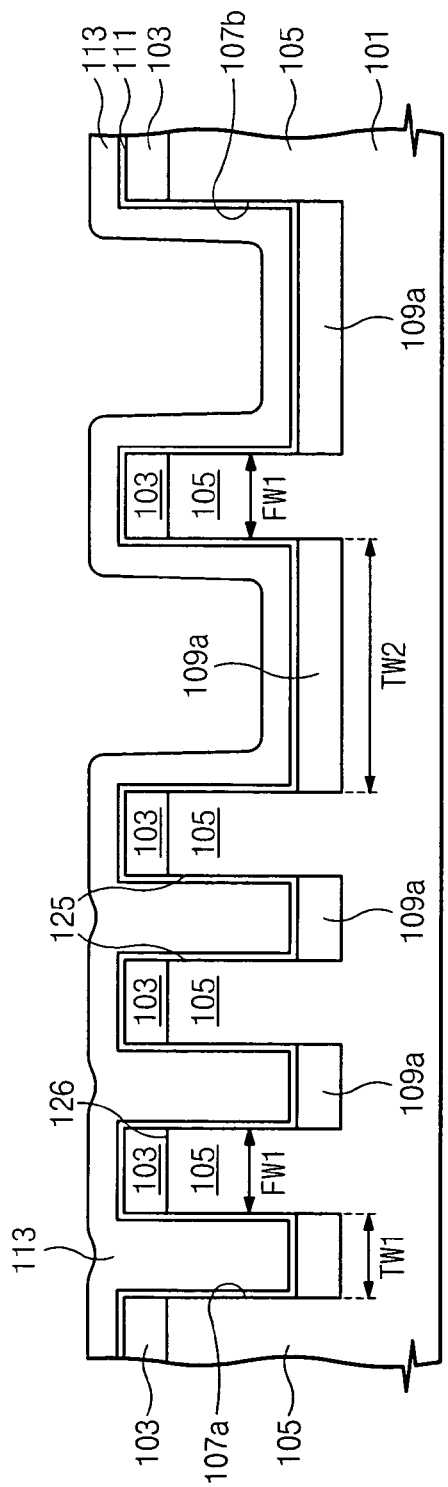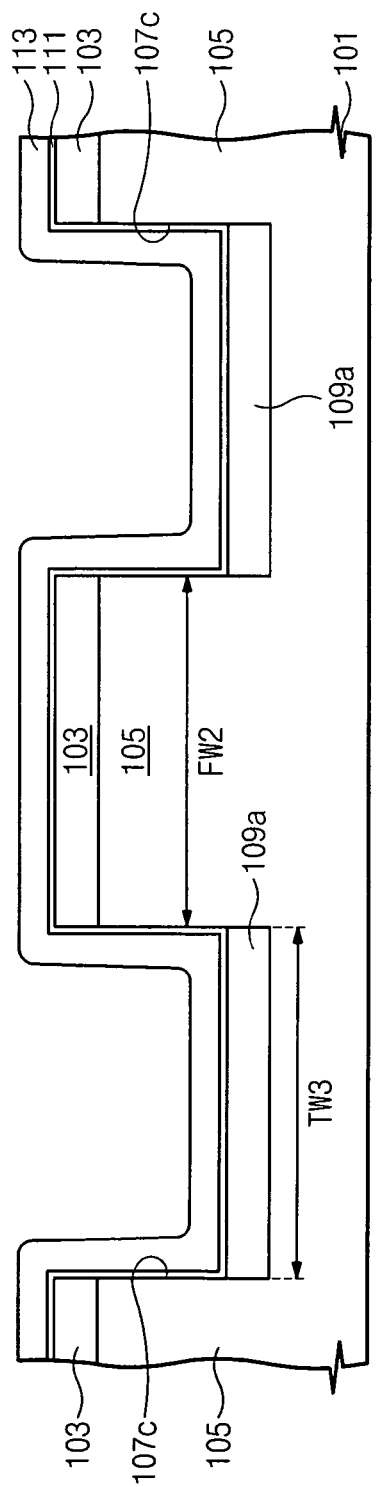

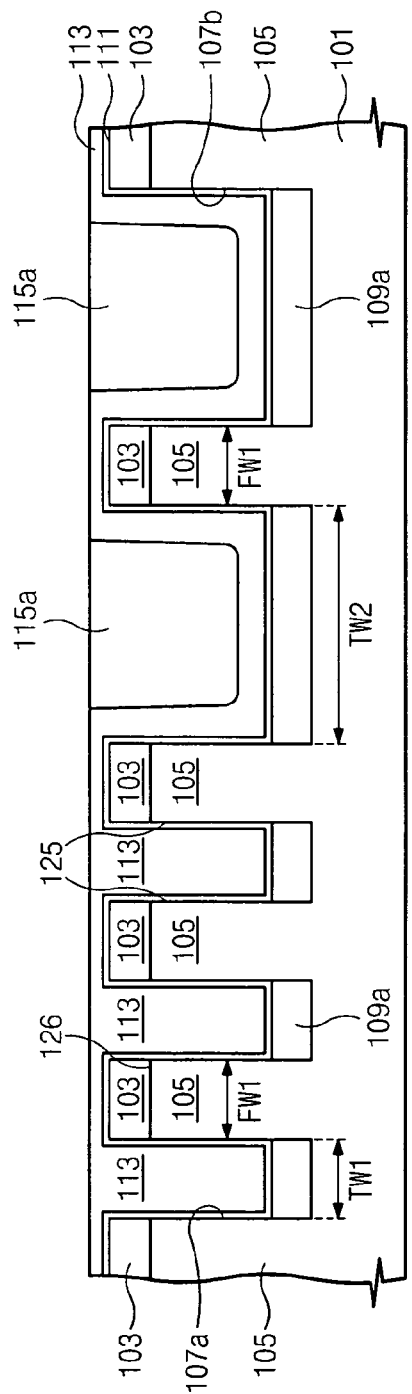
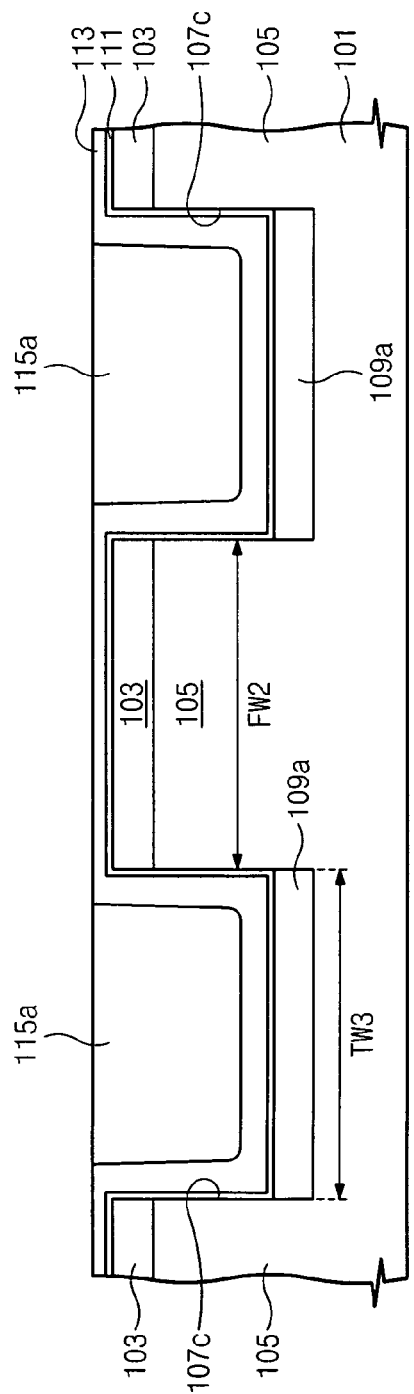

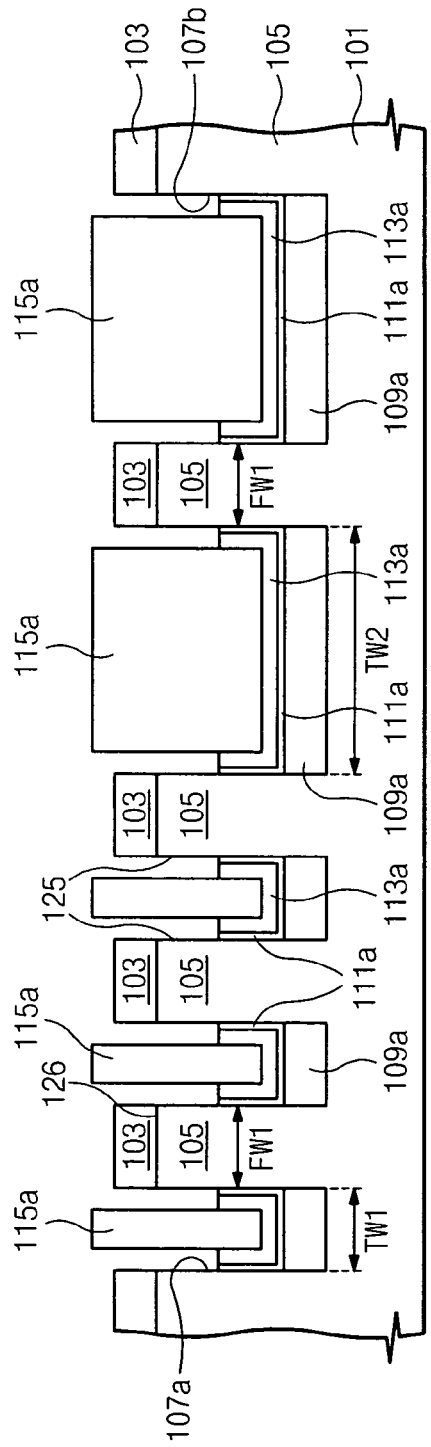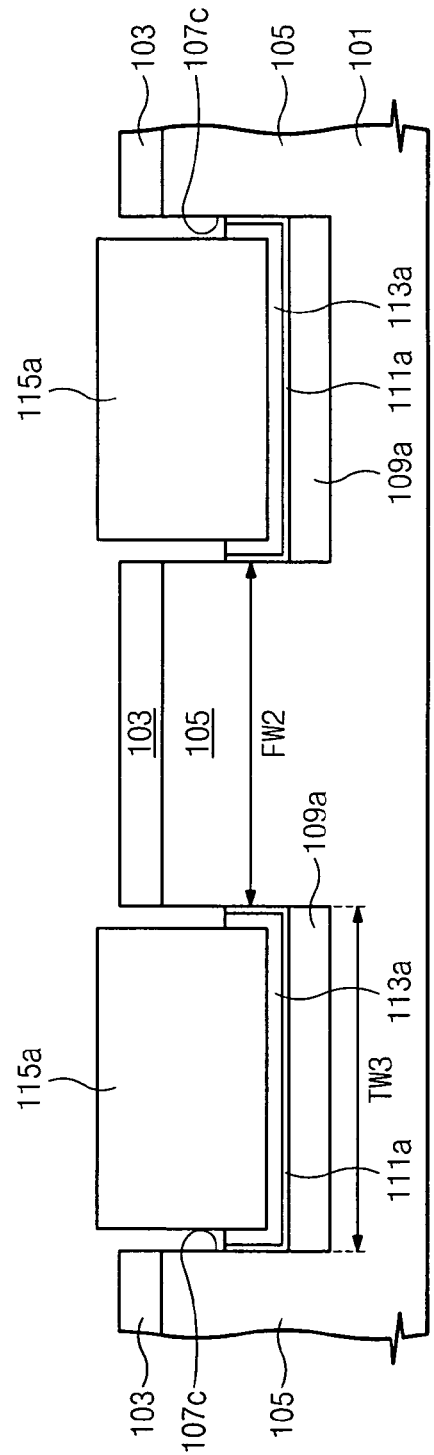

METHODS OF FABRICATING FIN-FIELD EFFECT TRANSISTORS (FIN-FETS) HAVING PROTECTION LAYERS

CLAIM OF PRIORITY

This application is related to and claims priority from Korean Patent Application No. 2003-43628, filed on Jun. 30, 2003, the disclosure of which is hereby incorporated herein by reference as if set forth in its entirety.

FIELD OF THE INVENTION

The present invention relates to methods of fabricating integrated circuit devices and integrated circuit devices related thereto and, more particularly, to methods of fabricating Fin-Field Effect Transistors (Fin-FETs) and related Fin-FETs.

BACKGROUND OF THE INVENTION

As integrated circuit devices become more highly integrated, the characteristics of these devices, for example, transistors, may continue to degrade. For example, a transistor may experience short channel effects, such as punch-through, Drain Induced Barrier Lowering (DIBL), sub-threshold swing, increased leakage current and the like.

To address the problems discussed above, integrated circuit manufacturers have provided double-gate-field-effect transistors and Fin-field effect transistors (Fin-FETs). Fin-FETs have gate electrodes on both sides of a channel, thus, allowing the gate electrodes to control channels on both sides. Accordingly, the likelihood of the occurrence of the short channel effect may be reduced.

Typically, methods of manufacturing Fin-FETs may include etching an integrated circuit substrate to form a fin, for example, a silicon fin, that defines a trench on the integrated circuit substrate. An insulation material may be provided in the trench or device isolation region to electrically separate neighboring fins. A surface of the insulation material may be recessed beneath a surface of the fins. In other words, after filling the trench with the isolation material, the isolation material is recessed beneath a top surface of the fin to expose sidewalls the fin. The isolation material may be recessed using a wet etchant.

However, the isolation material in the trench may be attacked during a subsequent cleaning process, which may result in the fins having various heights and a gate oxide layer having various thicknesses. Furthermore, the wet etchant may penetrate between the fin and the isolation material layer, thereby possibly generating a void in the isolation material layer. Accordingly, a subsequently formed gate-electrode material layer may penetrate into the void, causing an unwanted electrical connection between neighboring gate electrodes.

SUMMARY OF THE INVENTION

Embodiments of the present invention provide methods for fabricating Fin-Field Effect Transistors (Fin-FETs). A fin is formed on an integrated circuit substrate. The fin defines a trench on the integrated circuit substrate. A first insulation layer is formed in the trench such that a surface of the first insulation layer is recessed beneath a surface of the fin exposing sidewalls of the fin. A protection layer is formed on the first insulation layer and a second insulation layer is formed on the protection layer in the trench such that protection layer is between the second insulation layer and the sidewalls of the fin.

In some embodiments of the present invention, the protection layer may be an upper protection layer and a lower conformal protection layer may be formed in the trench on the sidewalls of the fin and the surface of the first insulation layer. In certain embodiments of the present invention, a surface of the second insulation layer may be recessed beneath the surface of the fin or a surface of the second insulation layer may be higher than the surface of the fin.

In further embodiments of the present invention, a plurality of fins may be formed on the integrated circuit substrate and the plurality of fins may define a plurality of trenches between the plurality of fins on the integrated circuit substrate. The plurality of trenches may have different widths. The plurality of trenches may include first and second trenches, the first trench having a first width and the second trench having a second width, wider than the first width. The protection layer filling the trench may be formed in the first trench having the first width and a conformal protection layer may be formed in the second trench having the second width.

In still further embodiments of the present invention, the protection layer may include a conformal protection layer in the trench. The second insulation layer may be formed on the protection layer such that the second insulation layer fills the trench. The second insulation layer may then be planarized such that at least a portion of the protection layer is exposed and a surface of the second insulation layer is recessed beneath the surface of the fin.

In some embodiments of the present invention, the exposed portion of the protection layer may be removed to expose upper portions of the sidewall of the silicon fin. A gate insulation layer may be formed on the fin and in the trench and a gate electrode may be formed on the gate insulation layer.

In further embodiments of the present invention, an etch mask pattern may be formed on the integrated circuit substrate and the substrate may be etched according to the etch mask pattern to form the fin. In certain embodiments of the present invention, a thermal oxidation layer may be formed on the sidewalls of the fin and a bottom surface of the trench and a liner layer may be formed on the thermal oxidation layer.

While the present invention is described above primarily with reference to methods of fabricating Fin-FETS, Fin-FETs are also provided herein.

BRIEF DESCRIPTION OF THE DRAWINGS

FIGS. 2A to 9A are cross-sections taken along the line A–A' of FIG. 1 illustrating processing steps in the fabrication of Fin-FETs according to further embodiments of the present invention.

FIGS. 2B to 9B are cross-sections taken along the line B–B' of FIG. 1 illustrating processing steps in the fabrication of Fin-FETs according to further embodiments of the present invention.

FIGS. 10A to 13A are cross-sections taken along the line A–A' of FIG. 1 illustrating processing steps in the fabrication of Fin-FETs according to still further embodiments of the present invention.

FIGS. 10B to 13B are cross-sections taken along the line B–B' of FIG. 1 illustrating processing steps in the fabrication of Fin-FETs according to still further embodiments of the present invention.

FIGS. 14A and 15A are cross-sections taken along the line A–A' of FIG. 1 illustrating processing steps in the fabrication of Fin-FETs according to some embodiments of the present invention.

FIGS. 14B and 15B are cross-sections taken along the line B–B' of FIG. 1 illustrating processing steps in the fabrication of Fin-FETs according to some embodiments of the present invention.

DETAILED DESCRIPTION OF EMBODIMENTS OF THE PRESENT INVENTION

Figure 1:
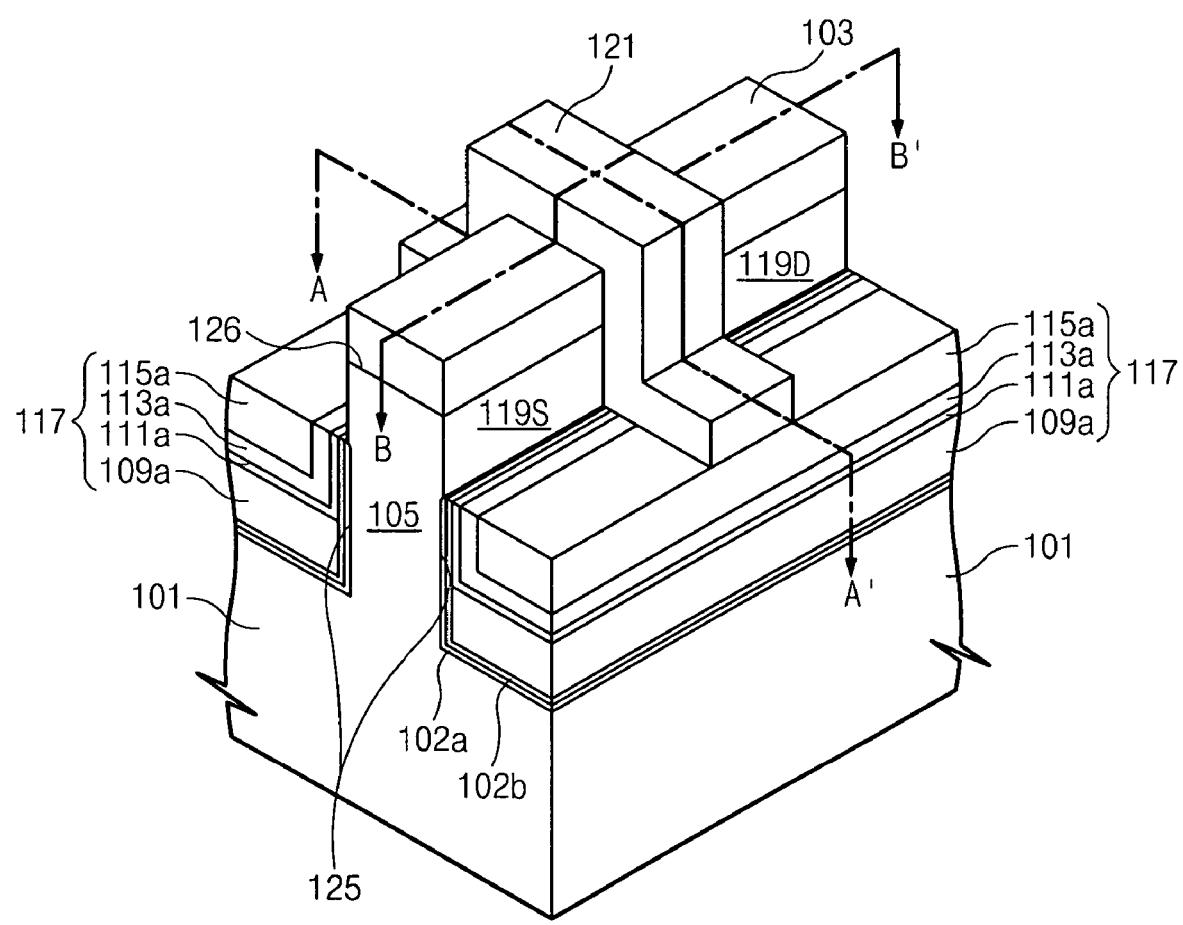
FIG. 1 is a cross-section illustrating a perspective view of Fin-Field Effect Transistors (Fin-FETs) according to some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention will now be described with respect to FIGS. 1A through 15B. As discussed herein, according to some embodiments of the present invention, a trench defined by a fin of a fin-field effect transistor (Fin-FET) may include a first insulation layer, a protection layer on the first insulation layer and a second insulation layer on the protection layer. The placement of the protection layer on the first insulation layer may protect the first insulation layer during a cleaning process, thereby possibly preventing the formation of a void in the first insulation layer. Furthermore, because the trench defined by the fin is filled using a two-step process, trenches having narrow widths may be filled without generating a void in the insulation layer according to some embodiments of the present invention.

Referring now to FIG. 1, a cross-section illustrating a perspective view of Fin-FETs according to some embodiments of the present invention will be discussed. It will be understood that although only a unit cell of a transistor is illustrated in the cross-section of FIG. 1, many unit cells may be included in the integrated circuit device without departing from the scope of the present invention. Furthermore, although the substrate is described herein as a silicon substrate or bulk silicon substrate, the present invention is not limited to this configuration. For example, the substrate may be a silicon-on-insulator (SOI) silicon substrate without departing from the scope of the present invention.

As illustrated in FIG. 1, a unit cell of a Fin-FET according to embodiments of the present invention includes a fin 105, for example, a silicon fin, that defines an active region of an integrated circuit substrate 101. The active region 105 of the Fin-FET may be electrically insolated from neighboring active regions (not shown) by a device isolation region 117.

As further illustrated in FIG. 1, the unit cell further includes source and drain regions 119S and 119D. A gate electrode 121 intersects the silicon fin 105. The source and drain regions 119S and 119D may be provided in the silicon fin on both sides of the gate electrode 121. The silicon fin 105 has sidewalls 125 and an upper surface 126. The fin 105 defines a trench in the integrated circuit substrate 101 and a device isolation region 117 is provided in the trench. An upper surface of the device isolation region 117 may be recessed beneath the surface 126 of the fin 105. A gate insulation layer (not shown) is disposed between sidewalls 125 of an exposed silicon fin 105 and the gate electrode 121. An etch mask pattern 103 is disposed between the silicon fin 105 and the gate electrode 121. Namely, the etch mask pattern 103 is provided on the surface 126 of the silicon fin 105. Accordingly, sidewalls 125 of the silicon fin 105 define channel regions.

According to some embodiments of the present invention, the device isolation region 117 includes multiple layers. In particular, the device isolation region 117 includes a first insulation layer 109a in the trench, a protection layer 113a on the first insulation layer and second insulation layer 115a on the protection layer. In certain embodiments of the present invention, a lower protection layer 111a may be provided on the first insulation layer 109a before the upper protection layer 113a is provided. The lower protection layer 111a may include a material having an etch selectivity with respect to the etch mask pattern 103. For example, if the etch mask pattern 103 includes nitride, the lower protection layer 111a may include an oxide. Furthermore, the upper protection layer 113a may include a material having an etch selectivity with respect to the first insulation layer 109a. For example, if first insulation layer 109a includes an oxide, the upper protection layer 113a may include a nitride.

As further illustrated in FIG. 1, the first insulation layer 109a may be provided on a floor 127 of the trench. If included, the lower protection layer 111a may be disposed on the first insulation layer 109a and on at least a portion of the sidewalls 125 of the silicon fin 105. The upper protection layer 113a may be disposed on the lower protection layer 111a if provided on the first insulation layer 109a and extend along at least a portion of the sidewalls 125 of the silicon fin 105. In other words, the lower 111a and upper 113a protection layers may be conformal layers. The second insulation layer 115a may be provided on the upper protection layer 113a, such that the upper protection layer 103a is between the second insulation layer 115a and the sidewalls 125 of the fin 105.

In some embodiments of the present invention, a thermal oxidation layer 102a and a liner nitride layer 102b may be provided between sidewalls 125 of the silicon fin 105 and the lower protection layer 111a and between a floor and sidewalls of the trench and the first insulation layer 109a. It will be understood that although embodiments of the present invention illustrated in FIG. 1 are illustrated as having the thermal oxidation layer 102a and the liner nitride layer 102b, embodiments of the present invention are not limited to this configuration. For example, the thermal oxidation layer 102a and/or the liner nitride layer 102b may be omitted without departing from the scope of the present invention.

Referring now to FIGS. 2A through 9B, processing steps in the fabrication of Fin-FETs according to some embodiments of the present invention will be discussed. FIGS. 2A through 9A are cross-sections taken along the line A–A' of FIG. 1 and FIGS. 2B to 9B are cross-sections taken along the line B–B' of FIG. 1. As illustrated in FIGS. 2A and 2B, an etch mask pattern 103 is formed on the integrated circuit substrate 101. A region covered with the etch mask pattern 103 is an active region, in which the silicon fin is formed. A region exposed by the etch mask pattern 103 is a device isolation region. The etch mask pattern 103 may include, for example, an oxide and/or a nitride. If the etch mask pattern 103 includes both an oxide and a nitride, the oxide and the nitride may be sequentially stacked on the substrate 101.

The substrate 101 may be etched according to the etch mask pattern 103. In other words, the portions of the substrate 101 not covered by the etch mask pattern 103 may be etched to a predetermined depth to form the silicon fins each having an upper surface 126 and sidewalls 125. The trenches 107a, 107b and 107c are defined by the silicon fins 105, i.e., the trenches 107a, 107b and 107c are between the silicon fins 105. The trenches 107a, 107b and 107c include a trench floor 127 and sidewalls 125, i.e., the sidewalls are the same as the sidewalls 125 of the silicon fin 105. In certain embodiments of the present invention, the trenches 107a, 107b and 107c may have first TW1, second TW2 and third TW3 widths, respectively.

In some embodiments of the present invention, the silicon fin 105 may have a rectangular shape and, may have first and second widths. For example, a first width FW1 of the fin 105 is measured in a direction parallel to a gate line and the second width of the fin 104 FW2 is measured in a direction orthogonal to the gate line, i.e., parallel to a bit line. Furthermore, silicon fins 105 according to embodiments of the present invention may have different widths at a peripheral circuit region and a cell region, for example, a size of the silicon fin may be larger at the peripheral circuit region than at the cell array region. Furthermore, silicon fins 105 may be formed densely in a cell array region and may be formed sparsely in the peripheral circuit region. Accordingly, the trench width in the cell array region may be wider than a trench width in the peripheral circuit region.

As illustrated in FIGS. 3A and 3B, the first insulation layer 109 is formed on the etch mask pattern 103 in the trenches 107a, 107b and 107c. The first insulation layer 109 may include, for example, an oxide of an Silicon-On-Glass (SOG) based insulation layer, such as Undoped-Silicon-Glass (USG) and TOSZ. In some embodiments of the present invention, a thermal oxidation layer may be formed using a thermal oxidation process on the sidewalls 125 and the floor 127 of the trench, and a liner nitride layer may be formed before forming the first insulation layer 109. The thermal oxidation layer may cure substrate damage resulting from the etching process, and the liner nitride layer may reduce the likelihood of oxidation.

As illustrated in FIGS. 4A and 4B, the lower insulation layer 109 is planarized until the etch mask pattern 103 is exposed. As a result, the first insulation layer 109 may remain only in the trench. The planarizing process may be performed using, for example, a chemical mechanical polishing (CMP) method. In performing CMP, a slurry capable of selectively etching oxide of the first insulation layer 109 with respect to a nitride of the etch mask pattern 103 may be used. The planarizing process may also use an etch-back process.

Figure 5A:
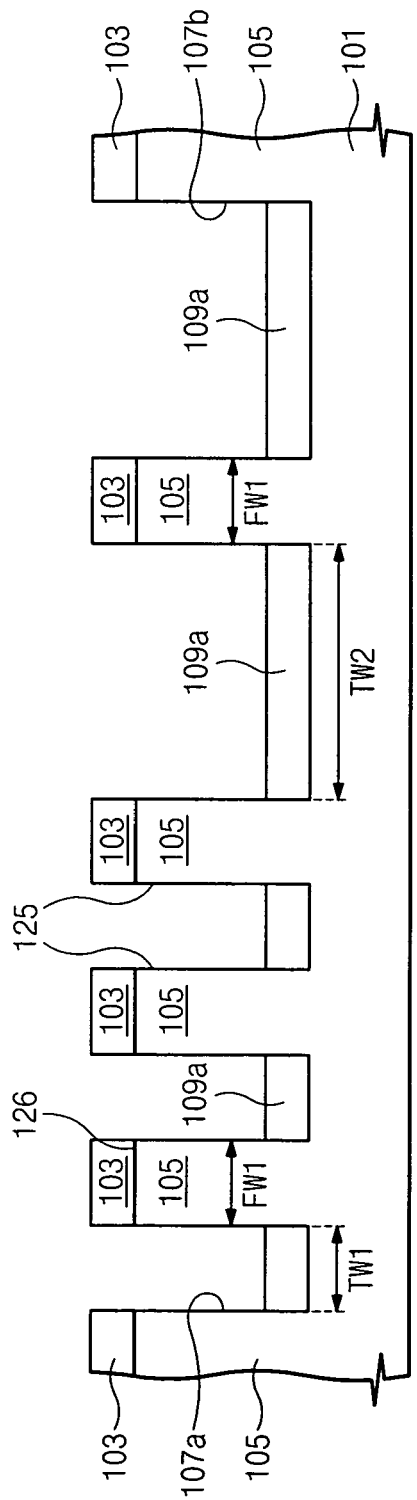
Figure 5B:
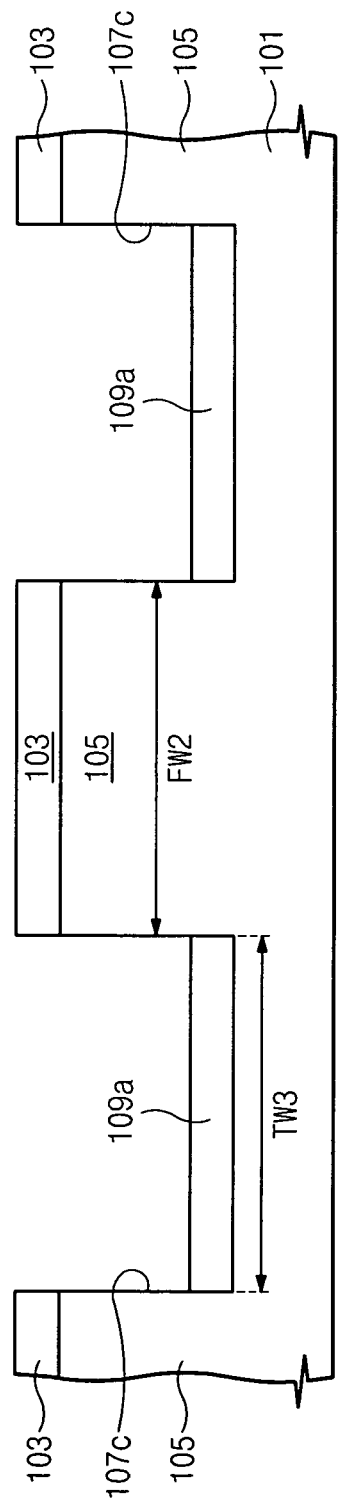

As illustrated in FIGS. 5A and 5B, a portion of the first insulation layer 109 is removed to expose a portion of both sidewalls 125 of the silicon fin 105. Accordingly, the first insulation layer 109a partially fills the trenches 107a, 107b and 107c, such that the upper surface of the first insulation layer 109a recessed beneath the surface 126 of the silicon fin 105. In some embodiments of the present invention, when a portion of the first insulation layer 109a is removed, an etch-back process may be performed. The etch back process may use an etching gas that only etches oxide without etching the silicon fin 105. In certain embodiments of the present invention, the etching gas may not etch the etch mask pattern 103. In some embodiments of the present invention, a wet etching process using an etchant, for example, HF, may be used instead of an etch back process.

In some embodiments of the present invention, both sidewalls 125 of the silicon fin 105 may be exposed by a one step process after forming the first insulation layer 109 in the trenches 107a, 107b and 107c. For example, the wet etching process using HF or an etch-back process may be used.

Referring now to FIGS. 6A and 6B, an optional lower protection layer 111 may be formed on the first insulation layer 109a. The optional lower protection layer 111 may be conformally formed on a floor 127 and inner sidewalls 125 of the residual trench and on the etch mask pattern 103. The optional lower protection layer 111 may protect the etch mask pattern 103 in a subsequent process discussed further below. In some embodiments of the present invention, the optional lower protection layer 111 may include a silicon oxide layer and may be formed using a thin film depositing method, such as chemical vapor deposition (CVD). An upper protection layer 113 may be formed on the optional protection layer 111, if provided, or on the first insulation layer 109a. The upper protection layer 113 may protect the first insulation layer 109a in a subsequent process discussed further below. In some embodiments of the present invention, the upper protection layer 113 may include a nitride.

In some embodiments of the present invention, the upper protection layer 113 may be conformally formed on the optional lower protection layer 111. The second insulation layer 115 is formed in the residual trench on the upper protection layer 113. The second insulation layer 115 may include, for example, High-Density-Plasma (HDP) oxide.

Figure 7A:
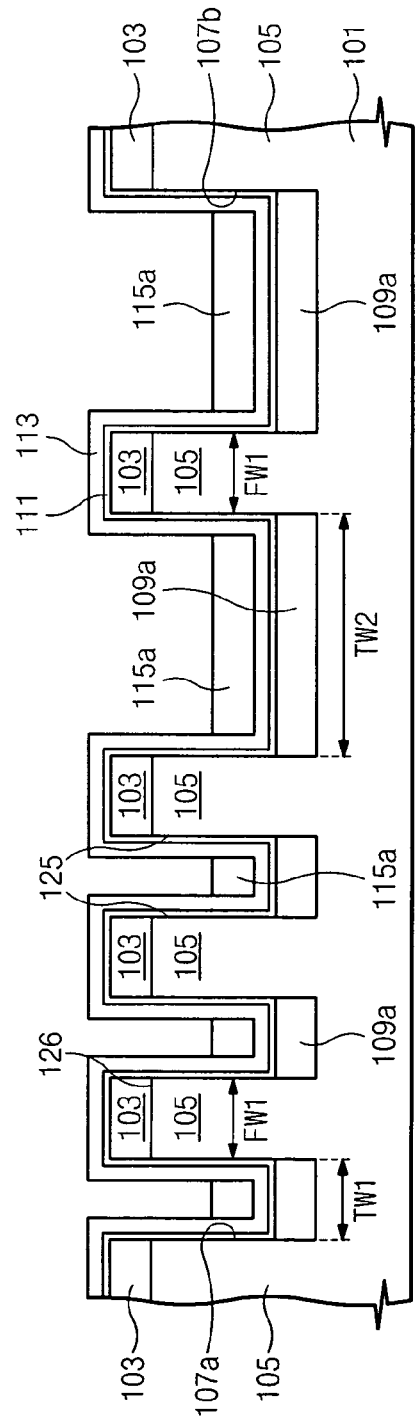
Figure 7B:
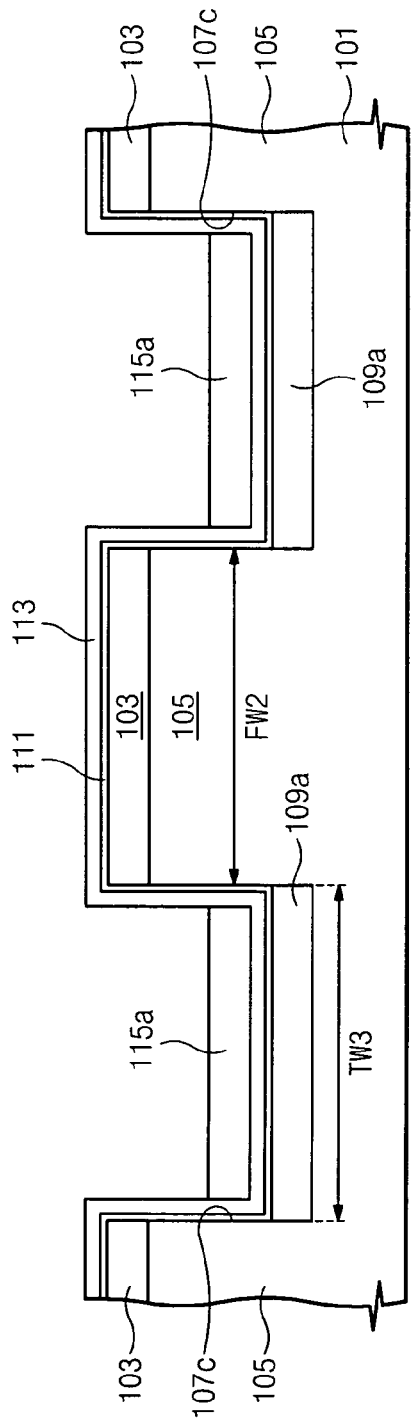

Referring now to FIGS. 7A and 7B, a portion of the second insulation layer 115 is removed such that a surface of the second insulation layer 115 is recessed beneath the surface 126 of the fin 105. The second insulation layer 115 may be partially removed by, for example, performing a wet etching process using HF or an etch-back process. The upper protection layer 113 may reduce the likelihood that the first insulation layer 109a is etched when the second insulation layer is partially removed. The planarizing process used to remove a portion of the second insulation layer 115 until the upper protection layer 113 is exposed may be performed prior to performing the wet etching process using HF or the etch-back process without departing from the scope of the present invention. The height of the exposed silicon fin 105 may be controlled by controlling the portion of the second insulation layer 115 that is removed.

Referring now to FIGS. 8A and 8B, the second insulation layer 115a is partially removed to remove the exposed upper protection layer 113. The upper protection layer 113a remains in contact with the second insulation layer 115a. In partially removing the upper protection layer 113, the lower protection layer 111 may reduce the likelihood that the etch mask pattern 103 is etched. A channel ion implantation process may be performed. The exposed lower protection layer 111 may be removed to expose sidewalls 125 of the silicon fin 105. At this time, the lower insulation layer 111a remains in contact with the upper protection layer 113a. In embodiments of the present invention including a thermal oxidation layer and a liner nitride layer, the thermal oxidation layer and the liner layer may also be partially removed to expose sidewalls 125 of the silicon fin 105.

The removal of the upper protection layer 113 may be carried out without etching the lower protection layer 111. For example, the upper protection layer 113 may be partially removed using an etchant, for example, phosphoric acid. The removal of the exposed lower protection layer 111 may be carried out without etching the upper protection layer 113a and the silicon fin 105. For example, the lower protection layer 111 may be partially removed using an etchant, such as fluoric acid.

Figure 9A:
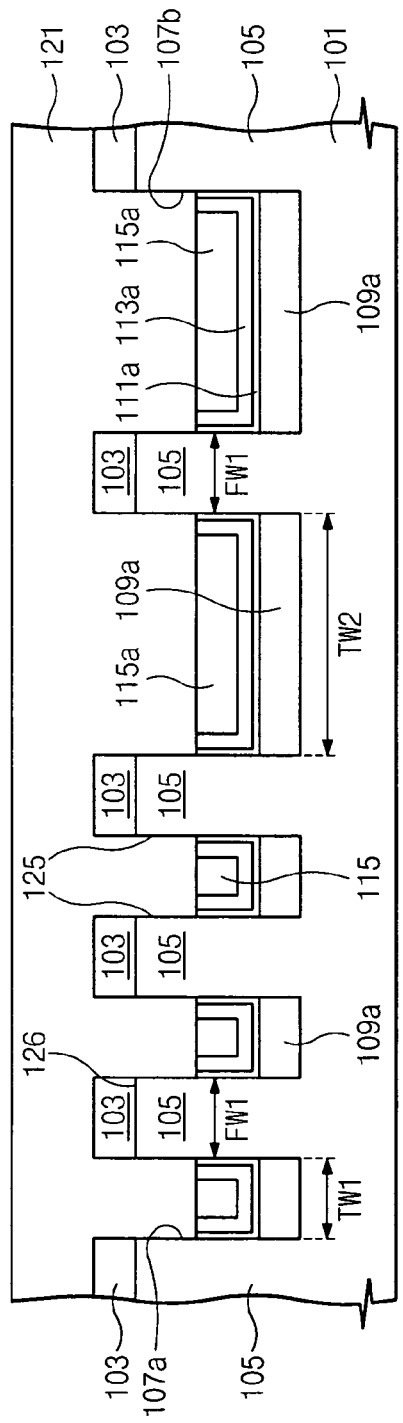
Figure 9B:
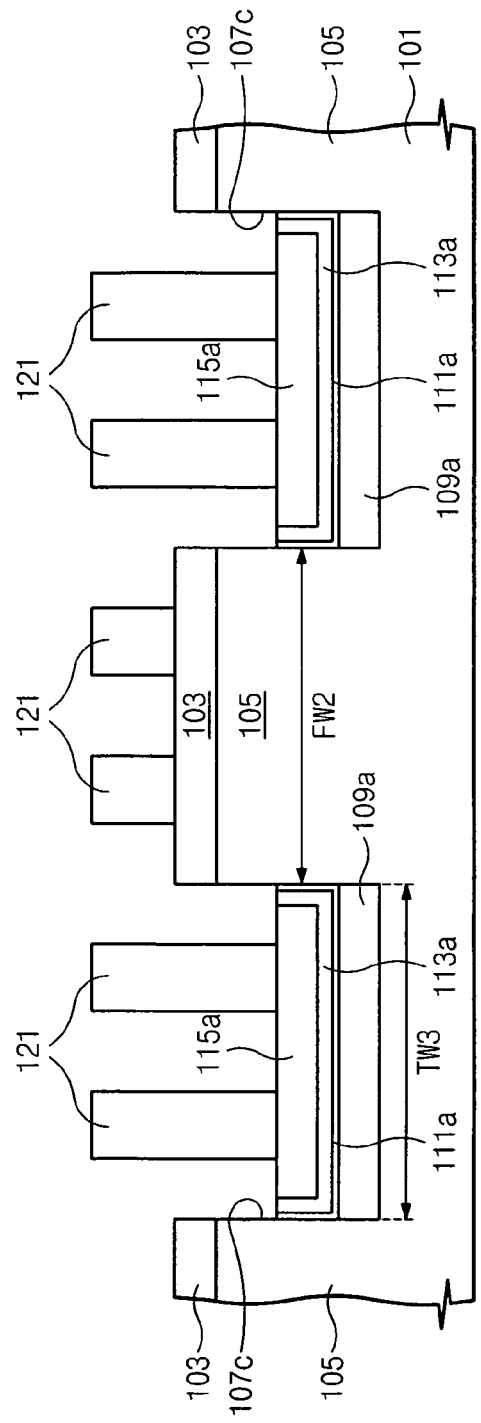

Referring now to FIGS. 9A and 9B, a gate oxide layer (not shown) is formed on sidewalls 125 of the exposed silicon fin 105 and a gate electrode is formed on the resultant structure. The gate electrode material may be patterned to form the gate electrode 121. The gate electrode material may include various materials. For example, the gate electrode material may include a single silicon layer structure or a multi-layered stacked structure of silicon and metal silicide. After forming the gate electrode 121, an ion implantation process may be performed to form the source and drain regions.

As discussed above, the upper protection layer 113a may be provided on the first insulation layer 109a. Accordingly, the first insulation layer 109a may be protected during a cleaning process, thereby possibly reducing the likelihood that a void will be formed in the first insulation layer 109a. In addition, since trenches 107a, 107b and 107 are filled using a two-step process, a trench having a narrow width may be filled without a generating a void in the insulation layers.

Referring now to FIGS. 10A through 13B, cross-sections illustrating processing steps in the fabrication of Fin-FET according to further embodiments of the present invention will be discussed. FIGS. 10A to 13A are cross-sections taken along the line A–A' of FIG. 1 and FIGS. 10B to 13B are cross-sections taken along the line B–B' of FIG. 1. Unlike embodiments of the present invention discussed above with respect to FIGS. 2A through 9B, the upper protection layer 113 may be formed to completely fill a trench having a narrow width (107a in FIG. 2A) and may be formed conformally in a trench having a relatively wide width (107b in FIGS. 2A and 107c in FIG. 2B). Details with respect to similar processing steps discussed above with respect to FIGS. 2A though 9B will not be discussed further herein with respect to FIGS. 10A through 13B.

As discussed above with respect to FIGS. 2A through FIG. 5B, after forming trenches 107a, 107b and 107c, the first insulation layer 109a and the optional lower protection layer 111, if provided, the upper protection layer 113 is formed as illustrated in FIGS. 10A and 10B. As further illustrated in FIGS. 10A and 10B, the upper protection layer 113 is formed to completely fill the trench 107a having a relatively narrow width and is formed conformally in the trenches 107b and 107c having a relatively wide width.

Referring now to FIGS. 11A and 11B, after forming the second insulation layer 115 on the upper insulation layer 113 and in the non-filled wide width trenches 107b and 107c, a planarizing process may be performed until the upper protection layer 113 outside of the trench is exposed. The planarizing process may be carried out using, for example, a CMP or an etch-back process.

Figure 12A:
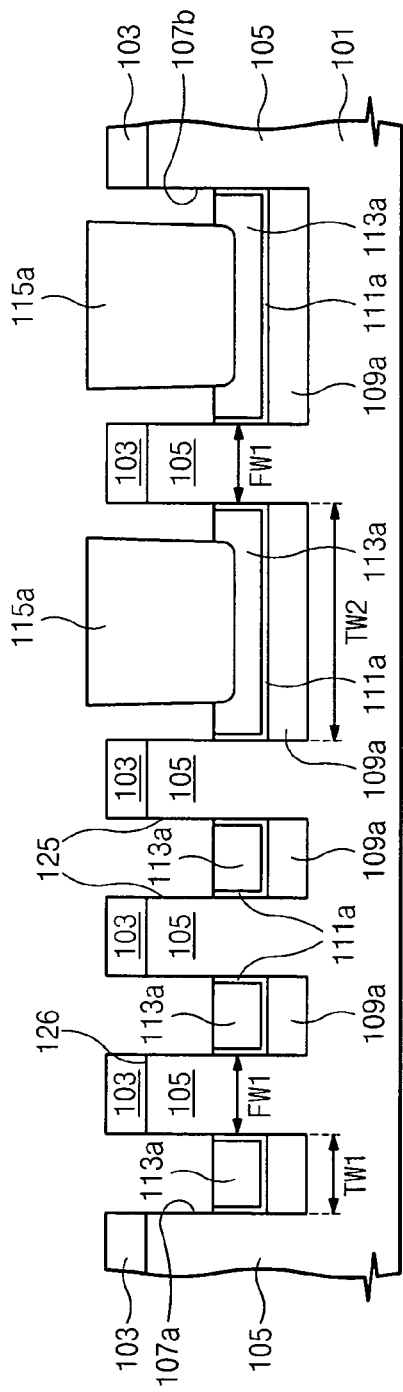
Figure 12B:
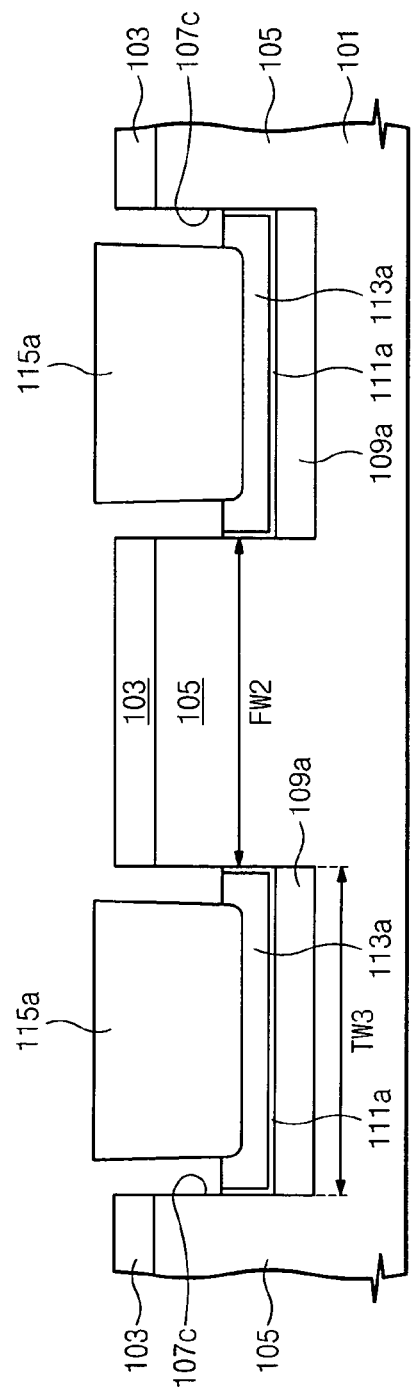

As illustrated in FIGS. 12A and 12B, a portion of the upper protection layer 113 and the lower protection layer 111 may be sequentially removed to expose both sidewalls 125 of the silicon fin 105. Accordingly, an upper surface of the upper 113 and lower 111 protection layers may be recessed beneath the surface 126 of the silicon fin 105. In some embodiments of the present invention, a channel ion implantation process may be performed before removing a portion of the lower protection layer 111. In particular, the upper protection layer 113 may be selectively removed using, for example, phosphoric acid with respect to the lower protection layer 111. The lower protection layer 111 may protect the etch mask pattern 103 when the portion of the upper protection layer 113 is being removed. After selectively removing a portion of the upper protection layer 113, an exposed portion of the lower protection layer 111 may be selectively removed using, for example, fluoric acid with respect to the remaining upper protection layer 113. The upper 113 and lower 111 protection layers may be partially removed by using a dry etching method. Before or after exposing both sidewalls 125 of the silicon fin 105, a portion of the second insulation layer 115a may be removed.

Figure 13A:
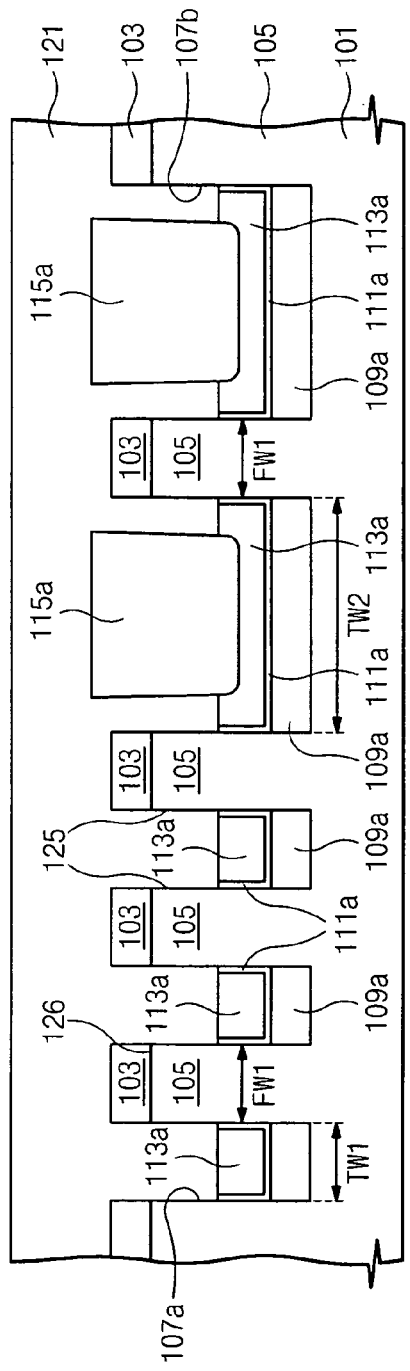
Figure 13B:
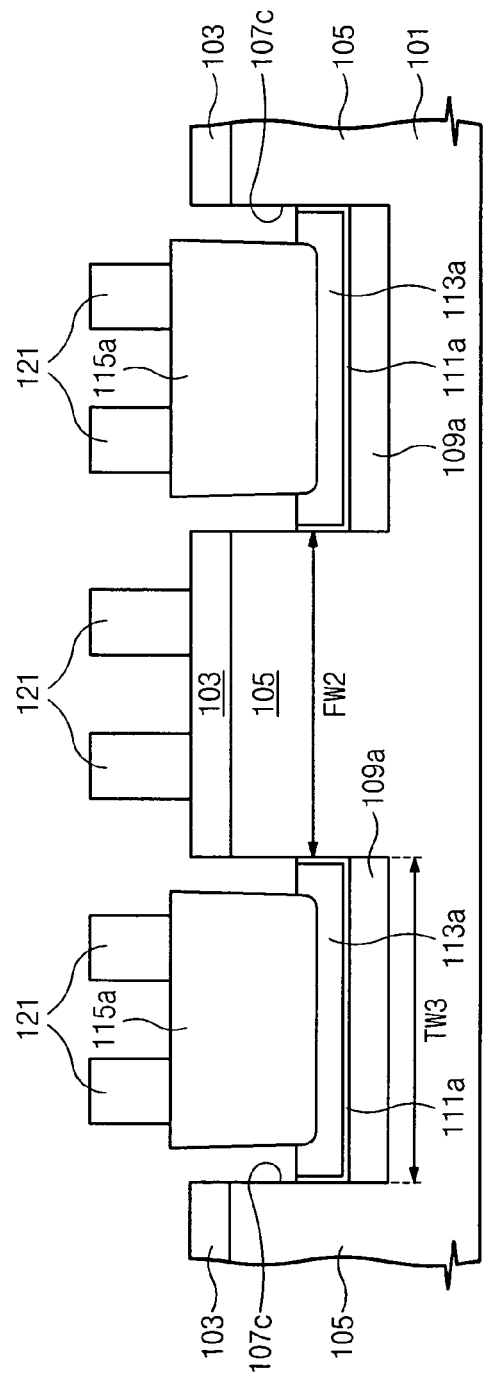

Referring now to FIGS. 13A and 13B, after forming a gate insulation layer (not shown), a gate electrode material may be formed on both sidewalls of the exposed silicon fin 105. The gate electrode material may be patterned to form the gate electrode 121. After forming the gate electrode 121, an ion implantation process is performed to form the source and drain regions.

Figure 14A:
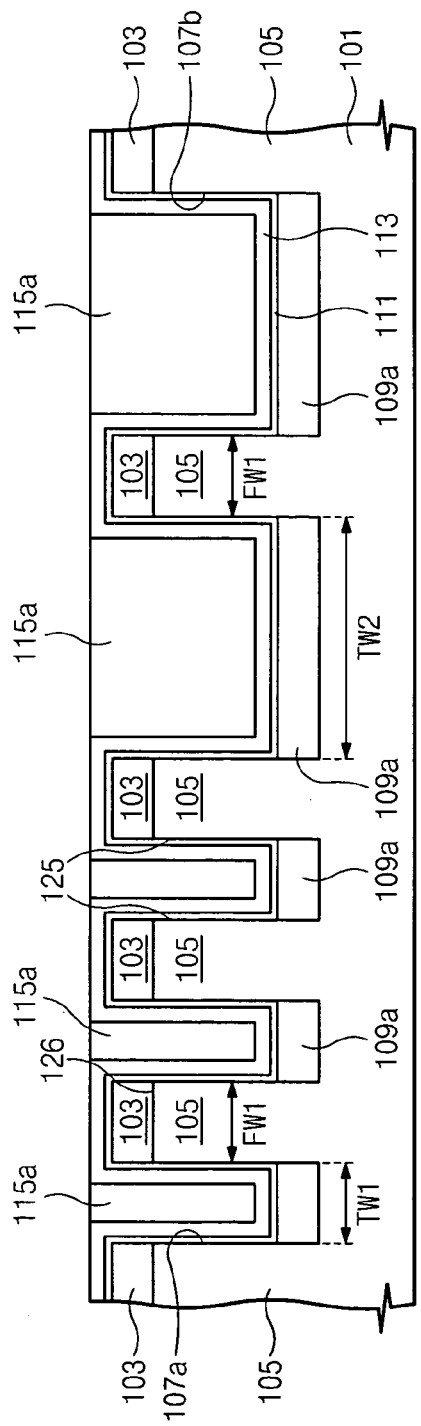

Referring now to FIGS. 14A through 15B, processing steps in the fabrication of Fin-FETs according to still further embodiments of the present invention will be discussed. FIGS. 14A and 15A are cross-sections taken along the line A–A' of FIG. 1 and FIGS. 14B and 15B are cross-sections taken along the line B–B' of FIG. 1. Unlike embodiments of the present invention discussed above with respect to FIGS. 2A through 9B, the upper surface of the upper insulation layer 115 is higher than that of the silicon fin 105. Details with respect to similar processing steps discussed above with respect to FIGS. 2A though 9B will not be discussed further herein with respect to FIGS. 14A through 15B.

Figure 14B:
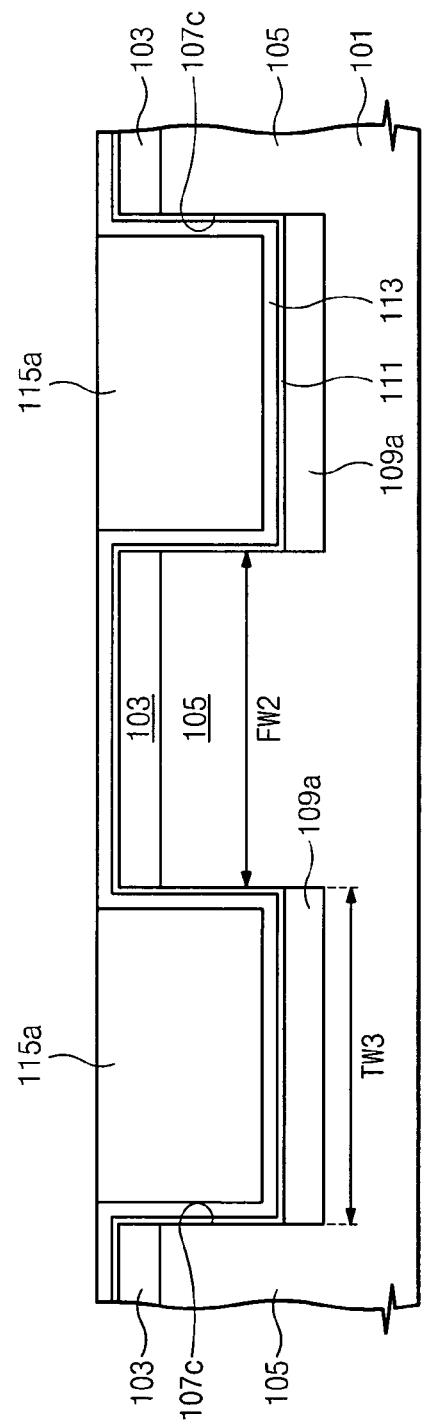

As discussed above with respect to FIGS. 2A through 6B, the silicon fins 105, the trenches 107*a*, 107*b* and 107*c*, the first insulation layer 109*a*, the lower protection layer 111, the upper protection layer 113 and the first insulation layer 15 are formed. As illustrated in FIGS. 14A and 14B, the second insulation layer 115 is planarized until the upper protection layer 115 is exposed.

As illustrated in FIGS. 15A and 15B, a portion of the upper protection layer 113 and the lower protection layer 111 are sequentially removed to expose both sidewalls 125 of the silicon fin 105. Accordingly, the upper surface height of the upper and lower protection layers 113 and 111 is recessed beneath the surface 126 of the silicon fin 105. In some embodiments of the present invention, the channel ion implantation process may be performed before removing a portion of the lower protection layer 111.

After forming a gate insulation layer (not shown), a gate electrode material may be formed on both sidewalls of the exposed silicon fin 105. The gate electrode material may be patterned to form the gate electrode 121. After forming the gate electrode 121, an ion implantation process is performed to form the source and drain regions. As previously mentioned, the upper protection layer is located on the first insulation layer. Accordingly, the upper protection layer is protected in the cleaning process, so that occurrence of the empty void is prevented.

As discussed above with respect to FIGS. 1A through 15B, embodiments of the present invention provide a trench defined by a fin of a Fin-FET which may include a first insulation layer, a protection layer on the first insulation layer and a second insulation layer on the protection layer. The placement of the protection layer on the first insulation layer may protect the first insulation layer during a cleaning process, thereby possibly preventing the formation of a void in the first insulation layer. Furthermore, because the trench defined by the fin is filled using a two-step process, a trench having narrow width may be filled without generating a void in the insulation layer according to some embodiments of the present invention. Therefore, reliable device isolation may be accomplished in the Fin-FET.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A method for fabricating a Fin-Field Effect Transistor (Fin-FET) comprising:

forming a fin on an integrated circuit substrate, the fin defining a trench on the integrated circuit substrate;

forming a first insulation layer in the trench such that a surface of the first insulation layer is recessed beneath a surface of the fin exposing sidewalls of the fin;

forming a protection layer on the first insulation layer; and forming a second insulation layer on the protection layer in the trench such that protection layer is between the second insulation layer and the sidewalls of the fin.

2. The method of claim 1, wherein the protection layer comprises an upper protection layer and wherein forming the upper protection layer is preceded by forming a lower conformal protection layer in the trench on the sidewalls of the fin and the surface of the first insulation layer.

3. The method of claim 1, wherein forming the second insulation layer comprises forming the second insulation layer such that a surface of the second insulation layer is recessed beneath the surface of the fin.

4. The method of claim 1, wherein forming the second insulation layer comprises forming the second insulation layer such that a surface of the second insulation layer is higher than the surface of the fin.

5. The method of claim 1, wherein forming the fin comprises forming a plurality of fins on the integrated circuit substrate, wherein the plurality of fins define a plurality of trenches between the plurality of fins on the integrated circuit substrate and wherein the plurality of trenches have different widths.

6. The method of claim 5, wherein the plurality of trenches comprises first and second trenches, wherein the first trench has a first width and the second trench has a second width, wider than the first width, wherein forming a protection layer comprises forming a protection layer filling the first trench having the first width and forming a conformal protection layer in the second trench having the second width.

7. The method of claim 1, wherein forming a protection layer comprises forming a conformal protection layer in the trench.

8. The method of claim 1, wherein forming the second insulation layer comprises:

forming the second insulation layer on the protection layer such that the second insulation layer fills the trench; and planarizing the second insulation layer such that at least a portion of the protection layer is exposed and a surface of the second insulation layer is recessed beneath the surface of the fin.

9. The method of claim 8, further comprising:

removing the exposed portion of the protection layer to expose upper portions of the sidewall of the silicon fin;

forming a gate insulation layer on the fin and in the trench; and forming a gate electrode on the gate insulation layer.

10. The method of claim 1, wherein forming the fin comprises:

forming an etch mask pattern on the integrated circuit substrate; and etching the substrate according to the etch mask pattern to form the fin.

11. The method of claim 1, wherein forming a first insulation layer is preceded by:

forming a thermal oxidation layer on the sidewalls of the fin and a bottom surface of the trench; and forming a liner layer on the thermal oxidation layer.

12. A method for fabricating a Fin-FET comprising:

forming an etch mask pattern on an integrated circuit substrate;

etching the substrate exposed by the etch mask pattern to form a fin, the fin defining a trench;

forming a first insulation layer in the trench such that a surface of the first insulation layer is recessed beneath a surface of the fin;

forming a conformal lower protection layer on the first insulation layer;

forming an upper protection layer on the lower protection layer;

forming a second insulation layer in the trench;

planarizing the second insulation layer until at least a portion of the upper protection layer is exposed;

removing the exposed portion of the upper protection layer on sidewalls of the trench exposing a portion of the lower protection layer; and removing the exposed portion of the lower protection layer.

13. The method of claim 12, wherein forming a conformal lower protection layer is preceded by:

forming a thermal oxidation layer on sidewalls of the trench by performing a thermal oxidation process; and forming a liner nitride layer on the thermal oxidation layer; and wherein removing the exposed portion of the lower protection layer is followed by:

removing an exposed portion of the liner nitride layer and the thermal oxidation layer exposing an upper portion of the sidewalls of the fin;

forming a gate insulation layer on the second insulation layer; and forming a gate conductive material on the gate insulation layer.

* * * * *